(12) United States Patent
Giaquinta et al.

(10) Patent No.: US 8,675,411 B2
(45) Date of Patent: Mar. 18, 2014

(54) BACKGROUND POWER CONSUMPTION REDUCTION OF ELECTRONIC DEVICES

(75) Inventors: Maria Giaquinta, Catania (IT); Antonino Conte, Tremestieri Etneo (IT); Rosario Roberto Grasso, Acicastello (IT); Francesco Nino Mammoliti, Riposto (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 185 days.

(21) Appl. No.: 13/170,657

(22) Filed: Jun. 28, 2011

(65) Prior Publication Data

US 2012/0002473 A1 Jan. 5, 2012

(30) Foreign Application Priority Data

Jun. 30, 2010 (IT) .............................. MI2010A1192

(51) Int. Cl.
*G11C 11/34* (2006.01)
(52) U.S. Cl.
USPC ............ 365/185.18; 365/185.05; 365/185.23; 365/185.26
(58) Field of Classification Search
USPC ............... 365/185.11, 229, 147, 226, 189.07, 365/189.09, 241, 210, 227, 185.23, 185.18, 365/185.27, 228, 230.06, 230.09
See application file for complete search history.

(56) References Cited

U.S. PATENT DOCUMENTS

| | | | |
|---|---|---|---|
| 5,781,062 A | 7/1998 | Mashiko et al. | |
| 6,061,279 A * | 5/2000 | Toda et al. | ..................... 365/194 |
| 2002/0054531 A1 | 5/2002 | Aruga | |
| 2003/0112691 A1 | 6/2003 | Sundaram et al. | |
| 2004/0145931 A1 | 7/2004 | Lin et al. | |
| 2008/0084749 A1* | 4/2008 | Lee et al. | ................. 365/185.18 |
| 2008/0285339 A1* | 11/2008 | Barkley | ..................... 365/185.2 |
| 2009/0003116 A1 | 1/2009 | Chauhan et al. | |

FOREIGN PATENT DOCUMENTS

EP 1113450 A1 7/2001

OTHER PUBLICATIONS

Italian Search Report and Written Opinion dated Feb. 23, 2011 from corresponding Italian Application MI20101192.

* cited by examiner

*Primary Examiner* — Richard Elms
*Assistant Examiner* — Hien Nguyen
(74) *Attorney, Agent, or Firm* — Wolf, Greenfield & Sacks, P.C.

(57) ABSTRACT

An electronic device including a set of functional block, and a biasing block for generating a set of bias voltages for the functional blocks. The electronic device further includes a holding block coupled between the biasing block and the functional blocks for providing each bias voltage to at least one corresponding functional block, for each bias voltage the holding block including a capacitive element for storing the bias voltage, and a switch element switchable between an accumulation condition wherein provides the bias voltage from the biasing block to the capacitive element and to the at least one corresponding functional block, and a release condition wherein isolates the capacitive element from the biasing block and provides the bias voltage from the capacitive element to the at least one corresponding functional block, and a control block for alternately switching the switching elements between the accumulation condition and the release condition.

21 Claims, 5 Drawing Sheets

BACKGROUND POWER CONSUMPTION REDUCTION OF ELECTRONIC DEVICES

CROSS REFERENCE TO RELATED APPLICATIONS

This application claims the priority benefit of Italian patent application number MI2010A001192, filed on Jun. 30, 2010, entitled BACKGROUND POWER CONSUMPTION REDUCTION OF ELECTRONIC DEVICE, which is hereby incorporated by reference to the maximum extent allowable by law.

BACKGROUND OF THE INVENTION

1. Field of the Invention

The solution according to one or more embodiments of the present invention relates to the field of electronic devices. More specifically, the solution relates to the reduction of a power consumption of electronic devices.

2. Discussion of the Related Art

Since some time the market of electronic products is increasingly focusing on products with low power consumption, particularly in the case of mobile products (e.g., computers, mobile phones and personal digital assistants). These mobile products include electronic devices (central processing unit, memory, display, etc.) for performing different operations. In particular, the electronic devices included in a generic mobile product should meet two main specifications. A first specification relates to a physical area occupation, which should be as small as possible in order to ensure the implementation of more electronic devices in the same mobile product or to reduce the size thereof. A second specification relates to a power consumption needed to operate such mobile devices. In more detail, such power is supplied by batteries which have a limited availability of energy. It is therefore desirable to reduce the power consumption of all the electronic devices included in the mobile products in order to increase the autonomy of such portable products with the same batteries used.

In particular, it is possible to identify two distinct phases of power consumption in an electronic device. A first phase is a phase of active power consumption associated with an operating condition of the electronic device (i.e., a period in which it actively performs an operation for which it was designed). A second phase is a phase of static power consumption associated with a standby condition of the electronic device; in this standby condition, the electronic device performs no operation but it is simply kept on to be ready to switch from the standby condition to the operating condition.

In general the standby condition of the electronic device may have a very long duration (e.g., several hours) during which the static power consumption unnecessarily dissipates energy stored in the batteries, thus reducing the autonomy of the corresponding portable device.

In the prior art various expedients have been implemented to reduce power consumption. Substantially these expedients are based on two different approaches. A first approach consists of partially or completely disabling the electronic devices in the standby condition; this dramatically reduces the static power consumption, but at the same time also the performance of the electronic device, as it requires a relatively long time to switch from the standby condition to the operating condition (needed for its bias voltages to reach a desired value thereof in a stable way).

A second approach involves the implementation of complex systems to manage the supplying of bias voltages in an advantageous way; in this case there is a substantial increase in the required area needed to implement the electronic devices, not always available in portable products; in addition, this enables a smaller reduction of the power consumption than the previous approach does, since such systems in turn consume some power for their correct operation.

This problem is particularly acute in programmable memory devices of the electrically/erasable type or EEPROM ("Electrically Erasable Programmable Read-Only Memory"). In fact, such memory devices use bias voltages of very high value (generally higher than a supply voltage of the corresponding portable products), which implies non-negligible power consumption.

SUMMARY OF THE INVENTION

In general terms, a solution according to one or more embodiments is based on the idea of storing the bias voltages in capacitive elements.

In particular, one or more aspects of a solution according to specific embodiments are set out in the independent claims, with advantageous features of the same solution that are set out in the dependent claims (whose wording is herein incorporated verbatim by reference).

More specifically, an aspect of a solution according to an embodiment provides an electronic device. The electronic device includes a set of functional blocks (e.g., a read/write unit and memory cells), and a biasing block for generating a set of bias voltages for the functional blocks. In the solution according to an embodiment, the electronic device further includes a holding block coupled between the biasing block and the functional blocks for providing each bias voltage to at least one corresponding functional block. For each bias voltage, the holding block includes a capacitive element (for storing the bias voltage), and a switching element; the switching element is switchable between an accumulation condition (wherein it provides the bias voltage from the biasing block to the capacitive element and to the corresponding at least one functional block), and a release condition (wherein it isolates the capacitive element from the biasing block and provides the bias voltage from the capacitive element to the corresponding at least one functional block). The electronic device further includes a control block for alternately switching the switch elements between the accumulation condition and the release condition.

Another aspect of a solution according to an embodiment provides a corresponding method (with the same advantageous features recited in the dependent claims for the memory device which apply mutatis mutandis to the method).

BRIEF DESCRIPTION OF THE DRAWINGS

A solution according to one or more embodiments, as well as additional features and its advantages will be better understood with reference to the following detailed description, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION

Figure 1:
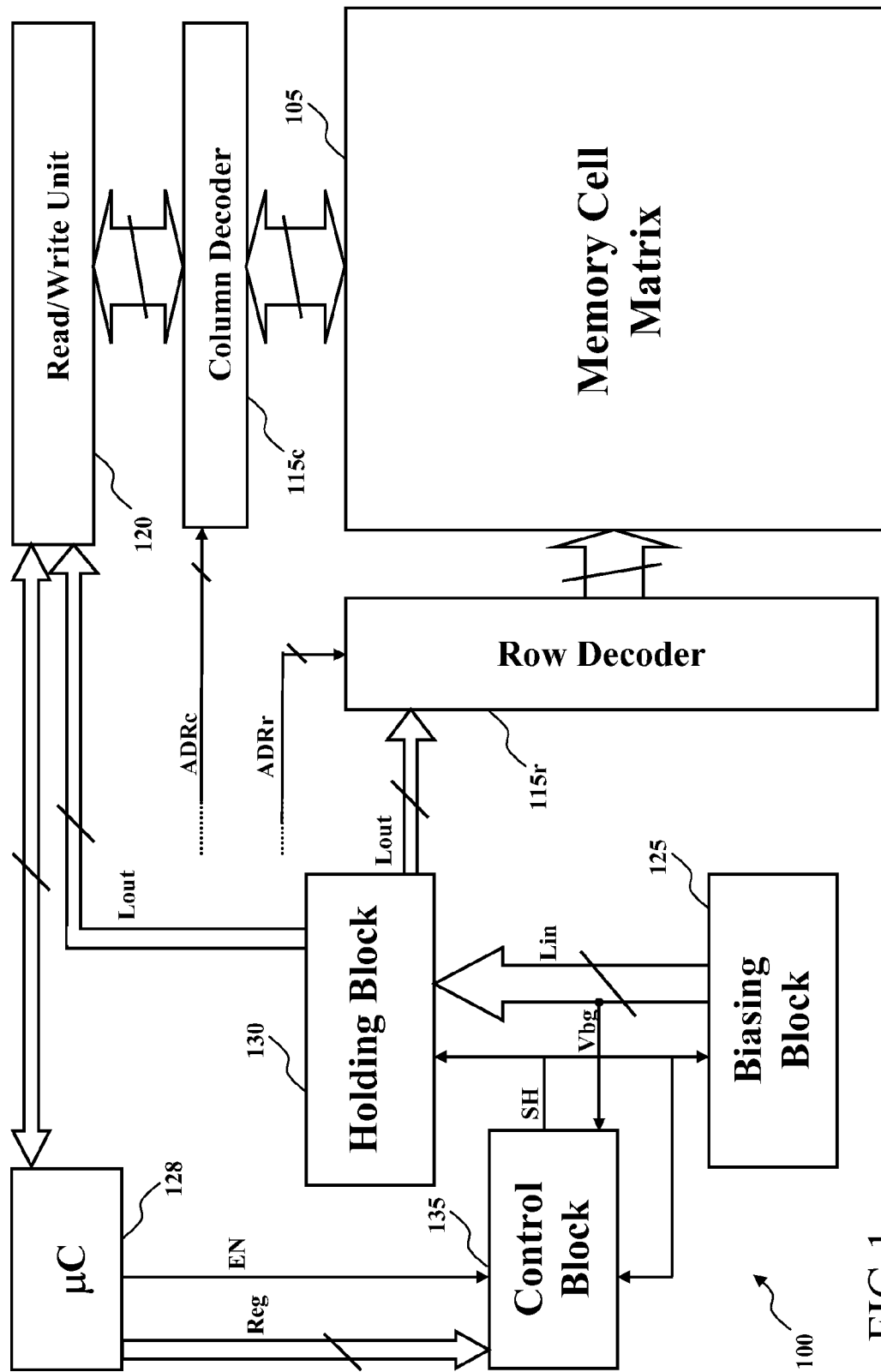
FIG. 1 shows a block diagram of an EEPROM memory device wherein an embodiment is applicable.

With particular reference to FIG. 1, there is shown a block diagram of a memory device 100, in which an embodiment is applicable; more specifically, the memory device 100 is an EEPROM-type memory device. The memory device 100 includes a matrix of memory cells 105 (not shown individually in the figure), which is organized into rows and columns. The memory device 100 also includes a row decoder 115r and a column decoder 115c. The access to the memory cells 105 of a selected word (in reading and writing) is made by decoding a row address ADRr and a column address ADRc, which are supplied to the row decoder 115r and to the column decoder 115c, respectively. The column decoder 115c selectively connects the memory cells 105 to a read/write unit 120, which contains circuitry used to read and write the selected memory cells 105 (e.g., driving circuits and comparators). A biasing block 125 provides a plurality of bias voltages Vbias needed for the operation of various blocks of the memory device 100 (and in particular, to be applied to the read/write unit 120 and to be applied to memory cells 105 through the row decoder 115r). A micro-controller 128 manages the operation of the entire memory device 100 (in particular, by interfacing with the read/write unit 120).

According to an embodiment, (as described in detail hereinbelow), the biasing block 125 provides the bias voltages Vbias to a holding block 130, through a plurality of bias lines Lin. The holding block 130 in turn transfers bias voltages Vbias' corresponding to the bias voltages Vbias, through bias lines Lout, to the read/write unit 120 and to the decoder 115r. Moreover, the biasing block 125 provides a reference bias voltage (for example, of bandgap) Vbg (included among the bias voltages Vbias) to a control block 135. The control block 135 also receives an enable signal EN and a register signal Reg from the micro-controller 128. The control block 135 sends a control signal SH to the holding block 135, to the biasing block 125 and to itself.

Figure 2:
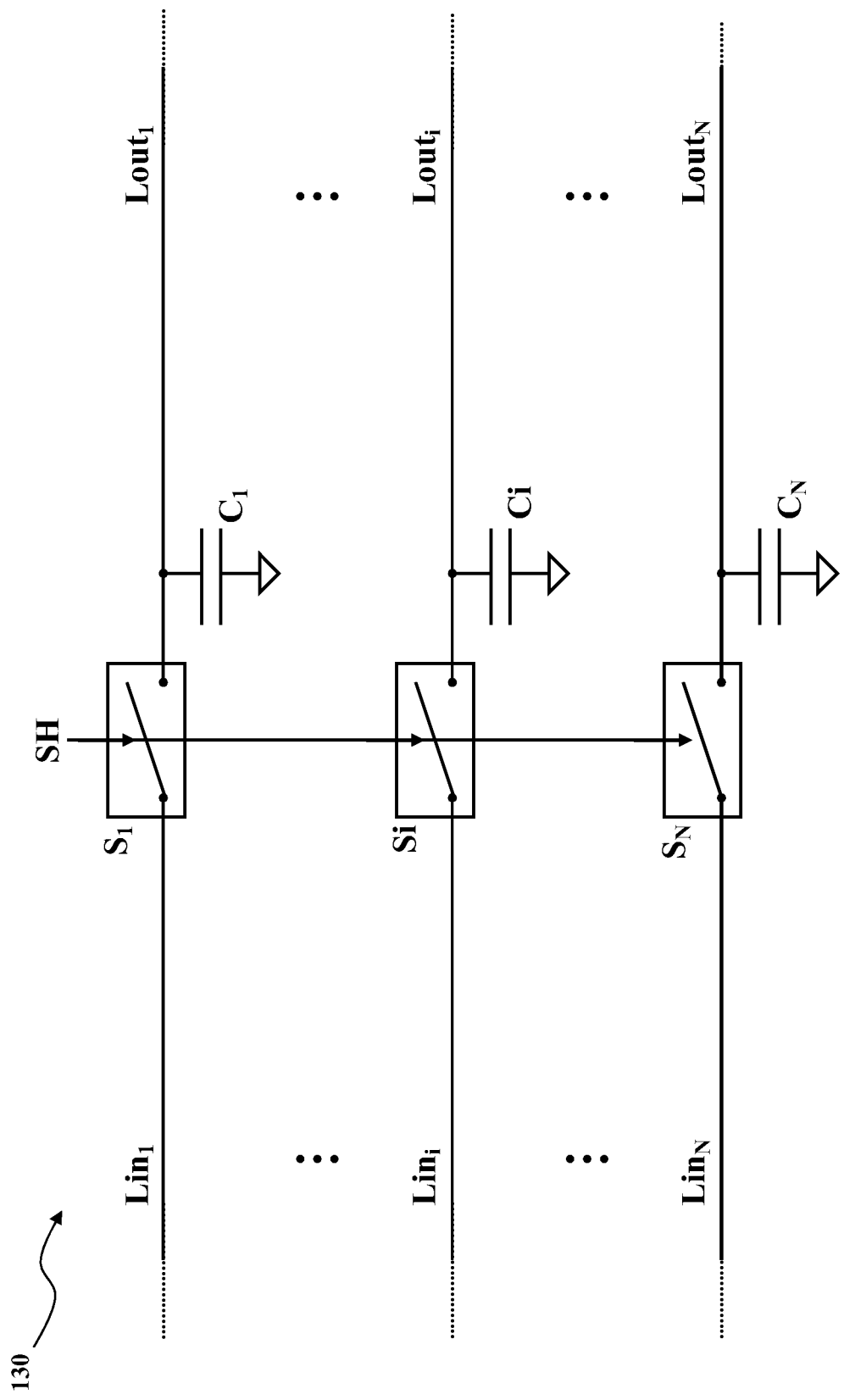
FIG. 2 shows a circuit diagram of a holding block of the memory device according to an embodiment.

FIG. 2 shows a circuit diagram of the holding block 130 according to an embodiment. For each bias line $Lin_i$ (where the subscript i denotes a value between 1 and a number N equal the total number of bias lines Lin) and a corresponding bias line $Lout_i$ (belonging to the bias lines Lout), the holding block 130 includes a controlled switch $S_i$ and a holding capacitor $C_i$. In more detail, the switch $S_i$ has a control terminal receiving the control signal SH (coming from the control block, not shown), a first conduction terminal connected to the bias line $Lin_i$, and a second conduction terminal connected to the bias line $Lout_i$. Such switch $S_i$ may include, for example, a PMOS-type transistor and a shifter circuit adapted to receive the control signal SH and convert it to a control voltage adapted to open and close the switch $S_i$ according to a logic value of the control signal SH. Moreover, the bias line $Lin_i$ is connected to a first terminal of the capacitor $C_i$, while a second terminal thereof is connected to a ground terminal of the memory device for receiving a reference (or ground) voltage.

The operation of the holding block 130 is the following. The biasing block (not shown in the figure) provides a corresponding bias voltage $Vbias_i$ (included among the bias voltages Vbias) to the bias line $Lin_i$.

When the control signal SH is asserted (e.g., at a high logic value equal to a supply voltage of the memory device) the switch $S_i$ is closed thereby coupling the bias line $Lin_i$ with the bias line $Lout_i$; in this way, the bias line Lout provides a corresponding bias voltage $Vbias_i' = Vbias_i$ (included among the bias voltages Vbias') to the corresponding blocks of the memory device (e.g., the read/write unit and the memory cells, not shown in the figure). At the same time, the capacitor $C_i$ is charged to the same bias voltage $Vbias_i' = Vbias_i$.

When the control signal SH is de-asserted (e.g., at a low logic value equal to the ground voltage) the switch $S_i$ is opened thereby decoupling the bias line $Lin_i$ from the bias line $Lout_i$. However, the bias line $Lout_i$ is maintained at the bias voltage $Vbias_i' = Vbias_i$ by the capacitor $C_i$. In such condition, the blocks connected to the bias line $Lout_i$ still work correctly since they receive the same bias voltage $Vbias_i'$ necessary for their operation (even if the biasing block is turned off, as will be described in detail below). In such condition, due to inevitable leakage currents, the capacitor $C_i$ will discharge slightly from the bias voltage $Vbias_i$ toward the ground voltage, thereby reducing the bias voltage $Vbias_i'$ correspondingly.

The control signal SH is then asserted again, so as to recharge the capacitor $C_i$ to the bias voltage $Vbias_i$ (at the same time turning on again the biasing block that provides the bias voltage $Vbias_i$)—with the same operations above described that are cyclically repeated.

Consequently, the bias voltage $Vbias_i'$ (provided to the blocks connected to the bias line $Lout_i$) will have a value that oscillates slightly over time under the bias voltage $Vbias_i$. However, this ripple has a predetermined maximum width so as not to cause any problem to the proper operation of the memory device.

In this way, it is possible to achieve a high reduction in power consumption associated with the memory device as a whole. In fact, according to an embodiment there is power consumption (i.e., energy is absorbed by an energy source outside the memory device—e.g., a battery) only during the times when the control signal SH is asserted. Therefore, the power consumption is reduced proportionally to the time when the control signal SH is maintained de-asserted.

In contrast, an alternative embodiment differs from what has been previously described as follows. In an operating condition of the memory device, the control signal SH is always asserted. In this way, the holding block 130 does not interfere with the operation of the memory device (once the capacitor $C_i$ is charged at the bias voltage $Vbias_i$ applied to the bias line $Lin_i$, which is directly transferred to the bias line $Lout_i$). In a standby condition, instead, the control signal SH is cyclically asserted and de-asserted as described above. This alternative embodiment thus allows reducing the power consumption in the standby condition only; it is particularly advantageous in the case wherein the functional blocks (not shown in the figure) require a high power consumption and/or a high precision of the biasing voltage in the operating condition (not sustainable by the capacitors $C_i$).

In an embodiment, the capacitors $C_i$ are implemented using stabilization capacitors already present on the connecting lines $Lout_i$. These stabilization capacitors are normally used to reduce fluctuations of the voltage/current on the bias lines $Lout_i$. In this way, there is no need to add more capacitors to the bias lines $Lout_i$; this allows saving area of the memory device and not increasing the total capacity on the bias lines Lout$_i$. Consequently, no delays in the operation of the memory device are introduced (i.e., the performance thereof is not affected).

The capacitors $C_i$ do not have necessarily the same capacity; in fact, they may be advantageously sized according to the value of the corresponding bias voltages Vbias$_i$ and according to a maximum value of an operating current (in the operating condition of the memory device) and/or of a leakage current (in the standby condition of the memory device) drawn by the blocks connected to the corresponding bias lines Lout$_i$. For example, the values of the capacities of the capacitors $C_i$ may vary from a few pF to a few tens of pF.

Figure 3:
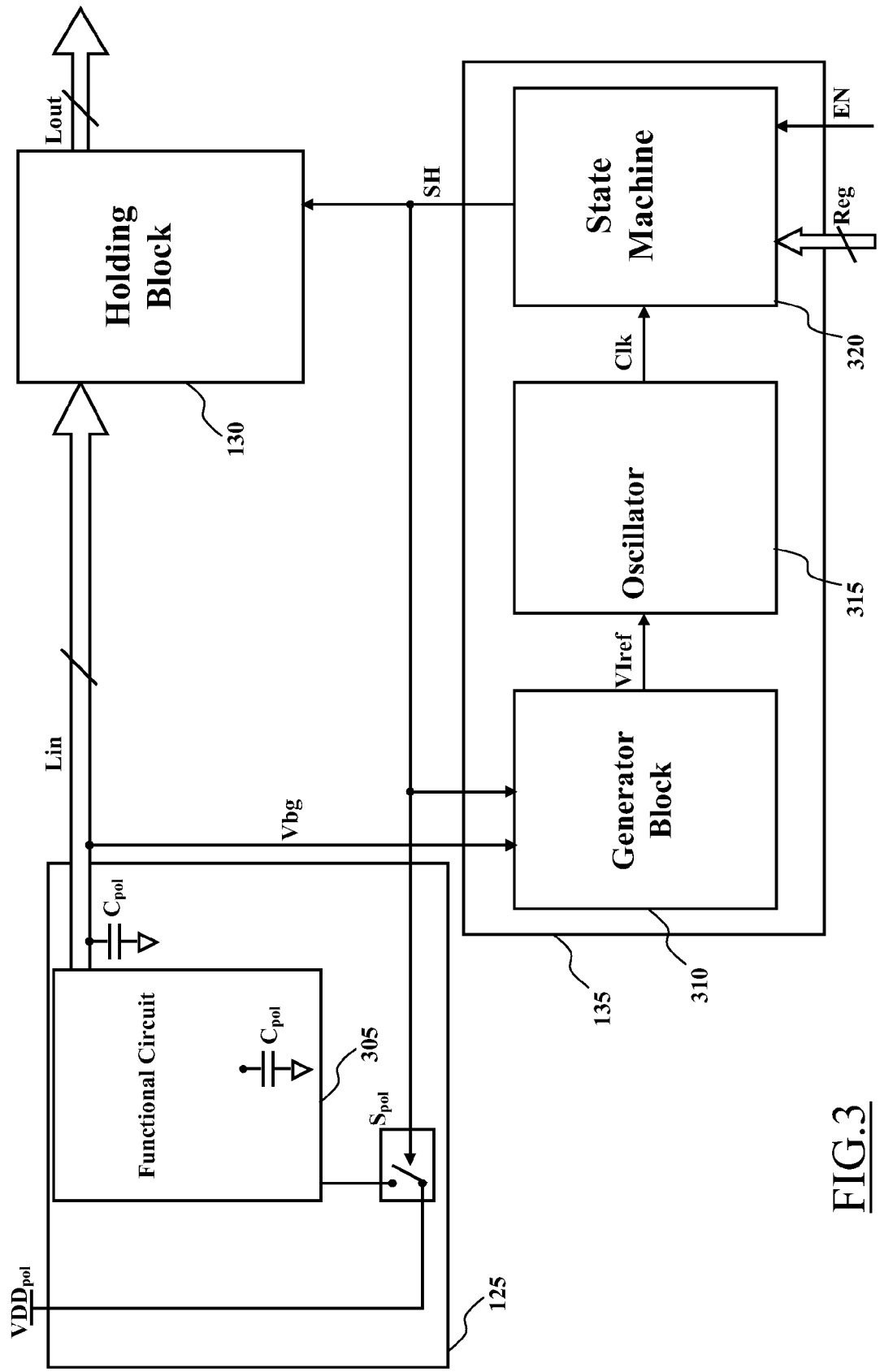
FIG. 3 shows a block diagram of a biasing block and of a control block of the memory device according to an embodiment.

FIG. 3 illustrates a block diagram of the biasing block 125 and of the control block 135 according to an embodiment of the invention.

The biasing block 125 has a power supply terminal VDD$_{pol}$, which receives a supply voltage VDD of the memory device (e.g., 1.8-3V). The biasing block 125 includes a functional circuit 305 (e.g., formed by charge pumps and bandgap generators), which generates all the bias voltages Vbias from the supply voltage VDD (e.g., from 1 to 10V).

According to an embodiment, the biasing block 125 includes a controlled switch S$_{pol}$ having a first conduction terminal connected to the power supply terminal VDD$_{pol}$, a second conduction terminal connected to an input terminal of the functional circuit 305, and a control terminal for receiving the control signal SH. Some holding capacitors (all denoted with the same reference C$_{pol}$) are connected to corresponding nodes of the biasing block 125, which are essential for the fast restart thereof (during the charging of the capacitors of the holding block). For example, a capacitor C$_{pol}$ is connected to each of the bias lines Lin (only one shown in the figure), and other capacitors C$_{pol}$ are arranged within the functional circuit 305 (only one shown in the figure).

The operation of the biasing block 125 is the following.

When the control signal SH is asserted (high logic value) the switch S$_{pol}$ is closed thereby connecting the input terminal of the functional circuit 305 to the power supply terminal VDD$_{pol}$. At the same time, each capacitor C$_{pol}$ is loaded to the corresponding voltage.

When the control signal SH is de-asserted (low logic value) the switch S$_{pol}$ is open thereby decoupling the input terminal of the functional circuit 305 from the power supply terminal VDD$_{pol}$. However, each bias line Lin is held at the corresponding bias voltage by its capacitor C$_{pol}$. In this condition, the functional circuit 305 absorbs energy from the capacitors C$_{pol}$, which then discharge slightly, thereby correspondingly reducing the supplied voltages.

The control signal SH is then asserted again, in order to recharge the capacitors C$_{pol}$ to the corresponding voltage—with the same operations described above that are cyclically repeated.

In this way, it is possible to further reduce the power consumption of the memory device (since as hereinabove there is a power consumption only during the times wherein the control signal SH is asserted, so that the power consumption is scaled down with the time wherein the control signal SH is maintained de-asserted).

The control block 135 instead includes a generator block 310, which generates a further reference voltage VIref from the reference voltage Vbg received from the biasing block 125. An oscillator block 315 (implemented in a way known in the art and therefore not described in detail) receives the reference voltage VIref and generates a periodic clock signal Clk with a period T proportional to the value thereof. A state machine 320 receives the clock signal Clk from the oscillator block 315, and also receives the enable signal EN and the register signal Reg from the micro-controller (not shown in the figure). In particular, the enable signal EN may be either a signal dedicated to enable the control block 135 or a general enable signal commonly used to enable the memory device as a whole. According to the enable signal EN, the register signal Reg and the clock signal Clk, the state machine 320 generates the control signal SH which is supplied to the biasing block 125 and to the holding block 130, and it is also supplied to the generator block 310. In particular, following a first assertion of the enable signal EN (corresponding to a start up of the memory device) an initialization phase is started in which the control signal SH is asserted for a predetermined number J of periods of the clock signal Clk to allow the charging of all the holding capacitors of the memory device to the respective voltages. After the initialization phase, the control signal SH is de-asserted for a number N of periods T of the clock signal Clk determined by the register signal Reg (to turn off the biasing block and to open the switches). At the end of the number N of periods T, the control signal SH is asserted for a predetermined number M of periods T of the clock signal Clk (to turn on the biasing block and close the switches). The same operations described above are cyclically repeated (until the enable signal EN is not de-asserted).

The above-described structure allows programming, by means of the register signal Reg, the duration of a release condition (control signal SH de-asserted) of the holding capacitors (in which they discharge). Such register signal Reg allows varying the duration of the release condition from a minimum value to a maximum value (e.g., from 5 µs to 130 µs with an increment step of 5-20 µs) according to a maximum acceptable ripple of the voltages at the holding capacitors that does not compromise the performance of the memory device. A subsequent accumulation condition (control signal SH asserted) of the holding capacitors (in which they are recharged) has instead a fixed duration, which is chosen so as to ensure a full recharge of the holding capacitors for any duration of the discharge period.

Figure 4:
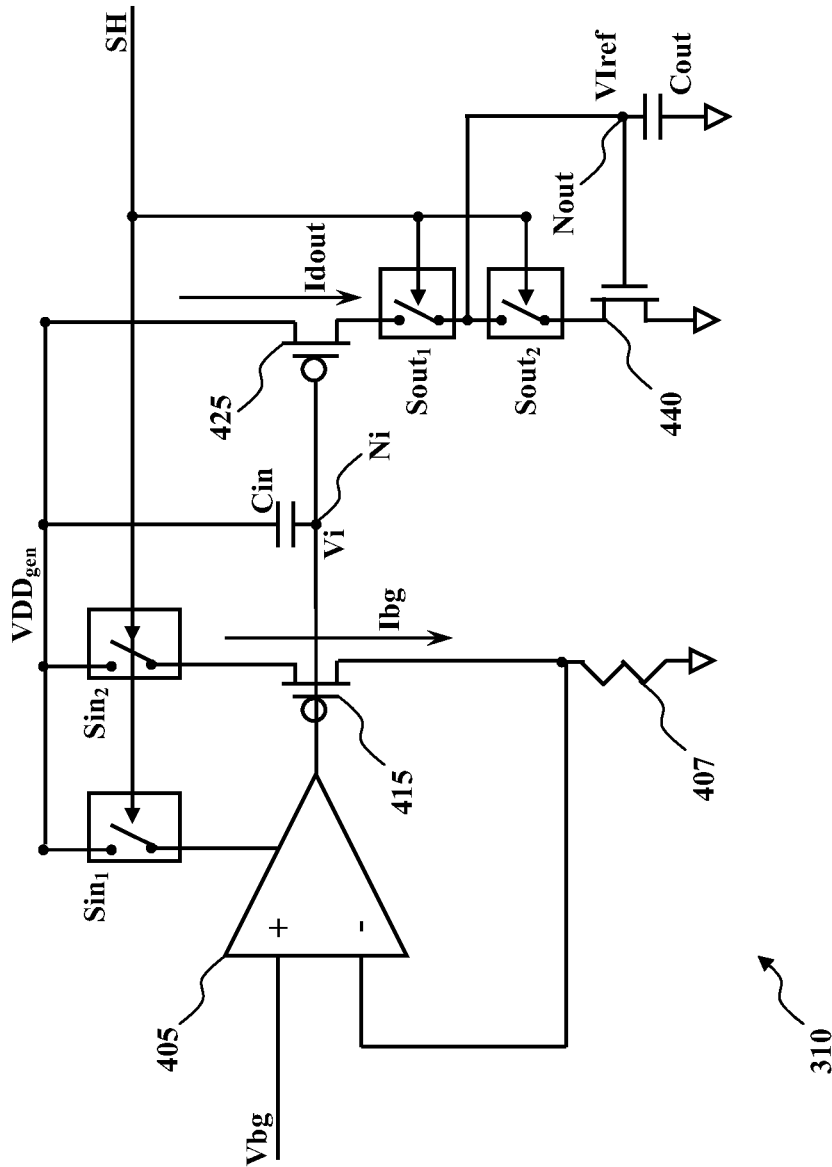
FIG. 4 shows a circuit diagram of a generator block included in the control block according to an embodiment.

FIG. 4 illustrates a circuit diagram of the generator block 310 according to an embodiment. The generator block 310 includes an operational amplifier 405 having a non-inverting input terminal (+) for receiving the reference voltage Vbg (from the biasing block, not shown in the figure), and an inverting input terminal (−) connected to a ground terminal (for receiving the ground voltage) through a resistor 407. An output terminal of the operational amplifier 405 is connected to an intermediate node Ni. A PMOS output transistor 415 has a drain terminal connected to the inverting terminal of the operational amplifier 405, and a gate terminal connected to the node Ni. A controlled switch Sin$_1$ has a first conduction terminal connected to a power supply terminal VDD$_{gen}$ (for receiving the supply voltage VDD), a second conduction terminal connected to a supply terminal of the operational amplifier 405, and a control terminal for receiving the control signal SH. Another controlled switch Sin$_2$ has a first conduction terminal connected to the power supply terminal VDD$_{gen}$, a second conduction terminal connected to a source terminal of the transistor 415, and a control terminal for receiving the control signal SH. The generator block 310 also includes a holding capacitor Cin connected between the node Ni and the power supply terminal VDD$_{gen}$.

A PMOS transfer transistor 425 has a gate terminal connected to the node Ni, a source terminal connected to the power supply terminal VDD$_{gen}$, and a drain terminal connected to a first conduction terminal of a controlled switch Sout$_1$. The switch Sout$_1$ has a control terminal for receiving the control signal SH and a second conduction terminal connected to a gate terminal of a NMOS transdiode transistor 440, which is connected to an output node Nout that provides the reference voltage VIref; the transistor 440 has a source terminal connected to the ground terminal. A further controlled switch $Sout_2$ has a first conduction terminal connected to the node Nout, a second conduction terminal connected to a drain terminal of the transistor 440, and a control terminal for receiving the control signal SH. A further holding capacitor Cout is connected between the node Nout and the ground terminal.

The operation of the generator block 310 is the following.

When the control signal SH is asserted (high logic value) all the switches $Sin_1$, $Sin_2$, $Sout_1$ and $Sout_2$ are closed thereby connecting the power terminal of the operational amplifier 405 and the source terminal of the transistor 415 with the power supply terminal VDDgen, and the drain terminal of the transistor 425 and the drain terminal of the transistor 440 with the gate terminal of the transistor 440. As a result of a negative feedback, the operational amplifier 405 reproduces the reference voltage Vbg across the resistor 407 that conducts a reference current Ibg equal to the ratio between the reference voltage Vbg and a resistance of the resistor 407. Such current Ibg flows completely through the transistor 415 (since the inverting input terminal of the operational amplifier 405 has infinite resistance), so that a corresponding intermediate voltage Vi is set to the gate terminal of the transistor 415; the voltage Vi is also set to the node Ni, thereby charging the capacitor Cin to the same. The voltage Vi is also applied to the gate terminal of the transistor 425, which determines a corresponding current Idout through the transistor 425, which depends on the relationship between the form factors (e.g., the ratio between width and length in MOS field effect transistors) of the transistors 425 and 415 (for example, with the currents through the transistors 415 and 425 that are equal if they have the same size). The current Idout charges the capacitor Cout until reaching the reference voltage VIref for which the transistor 440 turns on (diverting the current Idout toward the ground terminal). The generator block 310 then allows generating the reference voltage VIref from the reference voltage Vbg, keeping the non-inverting terminal of the operational amplifier 405 (which receives the reference voltage Vbg) decoupled from the node Vout (which generates the reference voltage VIref), thereby isolating the upstream biasing block from the downstream oscillator block (not shown in the figure).

When the control signal SH is de-asserted (low logic value) the switches $Sin_1$, $Sin_2$, $Sout_1$ and $Sout_2$ are open. Consequently, the operational amplifier 405 and the transistor 415 are turned off (as they do not receive the supply voltage $VDD_{gen}$ any longer). However, the node Ni is maintained at the voltage Vin by the capacitor Cin (apart from a slight discharge thereof). At the same time, the node Nout is maintained at the reference voltage VIref by the capacitor Cout; in this condition, the oscillator (not shown in the figure) receives the reference voltage VIref through the capacitor Cout, which then slightly discharges.

The control signal SH is then asserted again, so as to recharge the capacitor Cin to the voltage Vin and the capacitor Cout to the reference voltage Viref—with the same operations described above that are cyclically repeated.

In this way, it is possible to further reduce the power consumption of the memory device (since there is a power consumption only during the times when the control signal SH is asserted, so that the power consumption is reduced with the time wherein the control signal SH is maintained de-asserted).

Figure 5:
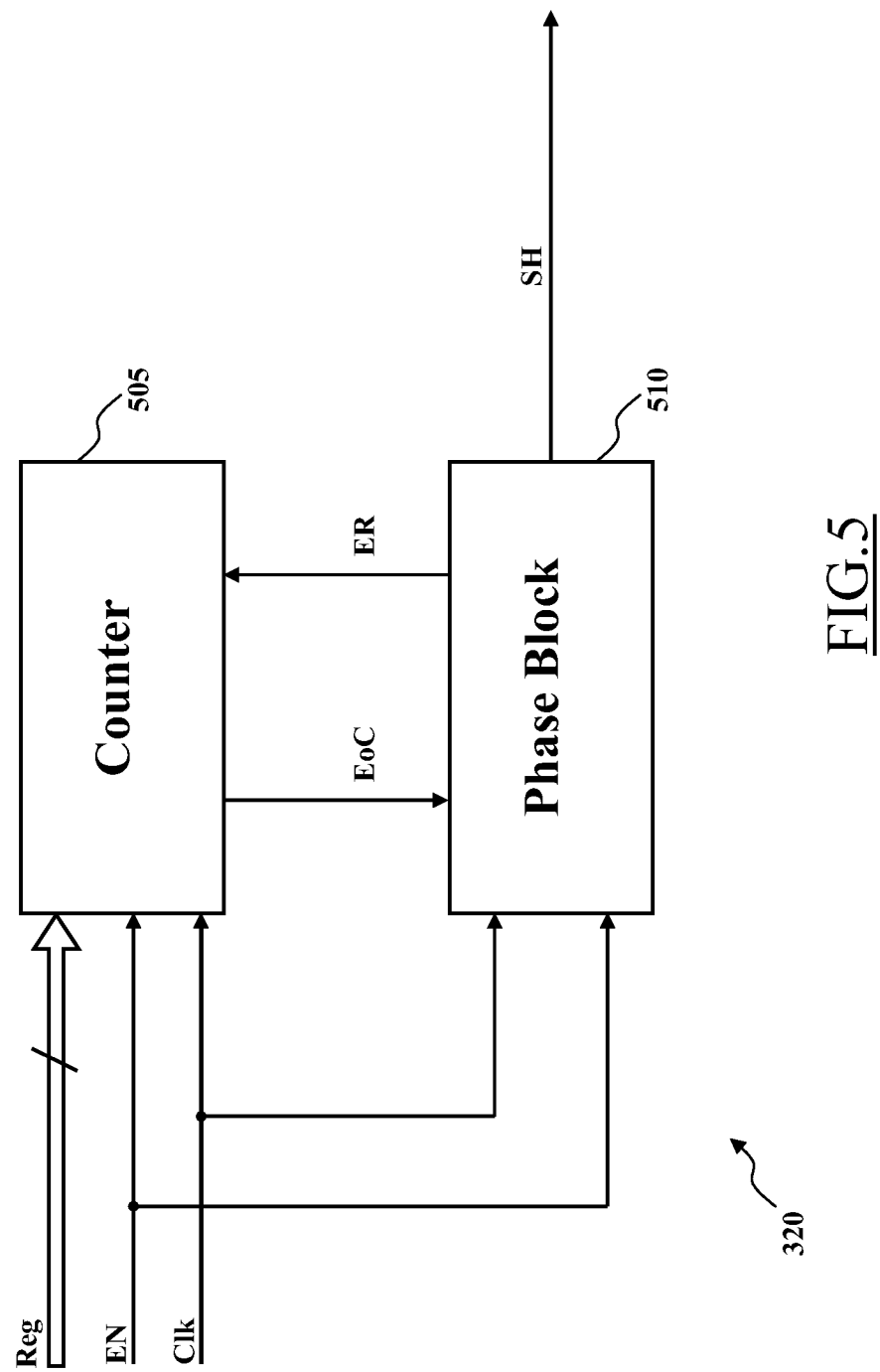
FIG. 5 shows a block diagram of a state machine included in the control block according to an embodiment.

FIG. 5 illustrates a block diagram of the state machine 320 included in the control block (not shown in the figure) according to an embodiment of the invention. The state machine 320 includes a counter 505 and a phase block 510. Both the counter 505 and the phase block 510 receive the clock signal Clk (from the oscillator, not shown in the figure) and the enable signal EN (from the micro-controller, not shown in the figure). The counter 505 further receives the register signal Reg (from the micro-controller as well), and an accumulation end signal ER from the phase block 510 to which in turn it provides an end of count signal EoC. The phase block 510 generates the control signal SH.

The operation of the state machine 320 is the following.

At the end of the initialization phase of the memory device described above, the phase block 510 impulsively asserts the accumulation end signal ER. In response thereto, the counter 505 is initialized to zero (with the signal EoC that remains de-asserted), and it is incremented at each period of the clock signal Clk; at the same time, the phase block 510 de-asserts the control signal SH—thereby determining the release condition. When the counter 505 reaches the value N determined by the register signal Reg, it asserts the signal EoC. In response thereto, the phase block 510 asserts the control signal SH—thereby determining the accumulation condition—for a predetermined number M of periods of the clock signal Clk. At the end of the M-th period T of the clock signal Clk the phase block 510 de-asserts the control signal SH again (to return to the release condition); at the same time, the phase block 510 impulsively asserts the signal ER, which re-initializes the counter 505 to cyclically repeat the same operations described above (until the enable signal EN is de-asserted).

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if the memory device has a different architecture or includes equivalent components (either separated or combined, in whole or in part). In addition, the memory device may have different operating characteristics; for example, the signals may be asserted and de-asserted at different reference voltages (even reversed to each other).

Nothing prevents from arranging the holding block to provide bias voltages to other functional blocks of the memory device, such as system oscillators and/or control and driving circuits of the charge pumps.

Furthermore, the holding block may be distributed instead of concentrated, i.e., a controlled switch and a holding capacitor may be provided directly to a terminal for receiving the respective bias voltage of each functional block of the memory device.

Obviously, the controlled switches may be implemented differently—for example, by using transistors with different doping, bipolar transistors or pass-gates.

Alternatively, the control block may alternately switch the switches between the accumulation condition and the release condition in any other condition of the memory device (for example, only in a energy-saving operating condition).

Nothing prevents from implementing dedicated holding capacitors to be used with or instead of the stabilization capacitors already provided in the memory device.

In addition, the control block may have an equivalent structure (e.g., without requiring a dedicated oscillator). Alternatively, more control signals may be generated to control different functional blocks in a specific way.

Nothing prevents from maintaining the biasing block always supplied or to provide more than one switch in the functional block—for example, a switch for each charge pump and bandgap circuit included in the functional circuit.

Moreover, the generator block may be provided with a greater/lower number of holding capacitors and switches.

Similarly, also the generator block may have a structure different from the described one.

Alternatively or in addition, both the accumulation and release conditions may be made programmable or both constant and predetermined.

Nothing prevents from implementing the solution in a device different from an EEPROM-type memory; for example, an embodiment may be implemented in acquisition devices (such as analog-to-digital converters and samplers).

The proposed solution lends itself to be implemented by an equivalent method (using similar steps, removing some steps being not essential, or adding further optional steps); moreover, the steps may be performed in different order, in parallel or overlapped (at least in part).

It should be readily apparent that the proposed solution might be part of the design of an integrated device. The design may also be created in a programming language; in addition, if the designer does not manufacture the integrated device or its masks, the design may be transmitted through physical means to others. Anyway, the resulting integrated device may be distributed by its manufacturer in the form of a raw wafer, as a naked chip, or in packages.

Moreover, the memory device may be integrated with other circuits in the same chip, or it may be mounted in intermediate products (such as motherboards) and coupled with one or more other chips (such as a processor). In any case, the memory device is adapted to be used in complex systems (such as a mobile phone).

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electronic device including a set of functional blocks, and a biasing block for generating a set of bias voltages to supply operating power to the functional blocks, comprising: a holding block coupled between the biasing block and the functional blocks for providing each bias voltage to a corresponding at least one functional block, for each bias voltage the holding block including a capacitive element for storing the bias voltage, and a switch element switchable between an accumulation condition in which the bias voltage is provided from the biasing block to the capacitive element and to the corresponding at least one functional block, and a release condition in which the capacitive element is isolated from the biasing block and provides the bias voltage from the capacitive element to the corresponding at least one functional block, and a control block for alternately switching the switch elements between the accumulation condition and the release condition, wherein the holding block supplies operating power to the functional blocks in the accumulation condition and in the release condition and wherein the control block includes a generator block for receiving a reference voltage included among the bias voltages from the biasing block and for generating a further reference voltage from the reference voltage, an oscillator block for receiving the further reference voltage from the generator block and for generating a periodic clock signal with a period depending on the further reference voltage, and a state machine for receiving the clock signal from the oscillator block and for generating a control signal according to the period of the clock signal, all the switch elements being controlled by the control signal.

2. The electronic device according to claim 1, wherein the control block is adapted to maintain the switch elements in the accumulation condition in an operating condition of the electronic device and to alternately switch the switch elements between the accumulation condition and the release condition in a standby condition of the electronic device.

3. The electronic device according to claim 1, wherein the electronic device includes a set of stabilization capacitors each for stabilizing a corresponding bias voltage, each capacitive element comprising a corresponding stabilization capacitor.

4. The electronic device according to claim 1, wherein the biasing block includes a power supply terminal for receiving a supply voltage, a first functional circuit for generating the bias voltages from the power supply, the first functional circuit having at least one first functional node for providing a corresponding first functional voltage, a set of first further capacitive elements each for storing a corresponding bias voltage and/or a corresponding first functional voltage, and a first further switch element switchable between a first further accumulation condition in which provides the supply voltage to the power supply terminal of the biasing block, and a second further release condition in which does not provide the supply voltage to the power supply terminal of the biasing block, the first further switch element being controlled by the control signal to switch alternately between the first further accumulation condition and the first further release condition.

5. The electronic device according to claim 1, wherein the generator block includes at least one second functional circuit for providing a second functional voltage to a second functional node of the generator block, and wherein for each second functional circuit the generator block further includes a second further capacitive element for storing the corresponding second functional voltage, and at least one second further switch element switchable between a second further accumulation condition in which enables the second functional circuit and a second further release condition in which disables the second functional circuit, the at least one second further switch element being controlled by the control signal for alternately switching between the second further accumulation condition and the second further release condition.

6. The electronic device according to claim 5, wherein the generator block includes a power supply terminal for receiving a further supply voltage and a ground terminal for receiving a ground voltage, and wherein the at least one second functional circuit includes a second functional circuit including an operational amplifier having a power supply terminal, a non-inverting input terminal for receiving the reference voltage and an inverting input terminal, a resistor having a first terminal connected to the ground terminal of the generator block and a second terminal connected to the inverting input terminal of the operational amplifier, an output transistor having a first conduction terminal, a second conduction terminal connected to the inverting input terminal of the operational amplifier and a control terminal connected to the output terminal of the operational amplifier, the corresponding second further capacitive element being connected between the output terminal of the operational amplifier and the power supply terminal of the generator block, and the at least one corresponding second further switch element including a second further switch element connected between the power supply terminal of the operational amplifier and the power supply terminal of the generator block, and another second further switch element connected between the first conduction terminal of the output transistor and the power supply terminal of the generator block.

7. The electronic device according to claim 6, wherein the at least one second functional circuit includes an additional second functional circuit including a first transfer transistor having a first conduction terminal connected to the power supply terminal of the generator block, a second conduction terminal and a control terminal connected to the output terminal of the operational amplifier, and a second transfer transistor having a first conduction terminal connected to the ground terminal of the generator block, a second conduction terminal and a control terminal interconnected to each other to provide the further reference voltage, the corresponding second further capacitive element being connected between the control terminal of the second transfer transistor and the ground terminal of the generator block, and the at least one corresponding second further switch element including an additional second further switch element connected between the second conduction terminal of the first transfer transistor and the control terminal the second transfer transistor, and an another additional second further switch element connected between the second conduction terminal and the control terminal of the second transfer transistor.

8. The electronic device according to claim 7, wherein the control block includes means for controlling the switching of the switch elements, of the first further switch element and/or of the at least one second switch element periodically with a period including a first portion of the period for the accumulation condition, the first further accumulation condition and the second further accumulation condition, respectively, and a second portion of the period for the release condition, the first further release condition and the second further release condition, respectively, at least one between the first portion of the period and the second portion of the period being programmable.

9. The electronic device according to claim 1, wherein the electronic device is an electrically erasable/programmable non-volatile memory device.

10. A method for reducing a power consumption of an electronic device, the method including the steps of:
  generating, by a biasing block, a set of bias voltages to supply operating power to a set of functional blocks, wherein, for each bias voltage switching a corresponding switch element alternately between an accumulation condition wherein the bias voltage is provided from the biasing block to a corresponding capacitive element adapted to store the bias voltage and to at least one corresponding functional block, and a release condition wherein the corresponding capacitive element is isolated from the biasing block and provides the bias voltage from the corresponding capacitive element to the corresponding at least one functional block, wherein the holding block supplies operating power to the functional blocks in the accumulation condition and in the release condition; and
  generating, by a control block, a control signal to control the switch element by receiving a reference voltage and generating a further reference voltage from the reference voltage, generating a periodic clock signal with a period depending on the further reference voltage, and generating the control signal according to the period of the clock signal.

11. An electronic device comprising:
  a functional block;
  a biasing block configured to generate a bias voltage to supply operating power to the functional block;
  a holding block coupled between the biasing block and the functional block, the holding block including a capacitive element configured to store the bias voltage and a switch element configured to switch between an accumulation condition in which the biasing block is coupled to the capacitive element and to the functional block, and a release condition in which the biasing block is isolated from the capacitive element and the functional block; and
  a control block configured to generate a control signal to control the switch element to alternately switch between the accumulation condition and the release condition, wherein the holding block supplies operating power to the functional block in the accumulation condition and in the release condition, and wherein the control block includes a generator block configured to receive a reference voltage and to generate a further reference voltage from the reference voltage, an oscillator block configured to receive the further reference voltage from the generator block and to generate a periodic clock signal with a period depending on the further reference voltage, and a state machine configured to receive the clock signal from the oscillator block and to generate the control signal according to the period of the clock signal.

12. An electronic device as defined in claim 11, wherein the biasing block is configured to generate a plurality of bias voltages and wherein the holding block includes a corresponding plurality of capacitive elements and switch elements.

13. An electronic device as defined in claim 11, wherein the functional block comprises an electrically erasable/programmable read-only memory device.

14. An electronic device as defined in claim 11, wherein the control block is controlled to maintain the switch element in the accumulation condition in an operating mode of the functional block and to alternately switch the switch element between the accumulation condition and the release condition in a standby mode of the functional block.

15. An electronic device as defined in claim 11, wherein the capacitive element comprises a stabilization capacitor configured to stabilize the bias voltage.

16. An electronic device as defined in claim 11, wherein the release condition has a variable duration based on a maximum acceptable ripple of the bias voltage and the accumulation condition has a fixed duration selected to ensure a full recharge of the capacitive element.

17. A method for operating an electronic device, comprising:
  generating, by a biasing block, a bias voltage to supply operating power to a functional block;
  switching, by a switch element, between an accumulation condition in which the bias voltage is coupled to a capacitive element and to the functional block, and a release condition in which the biasing block is isolated from the capacitive element and the functional block, wherein the bias voltage is supplied to the functional block in the accumulation condition and in the release condition; and generating, by a control block, a control signal to control the switch element by receiving a reference voltage and generating a further reference voltage from the reference voltage, generating a periodic clock signal with a period depending on the further reference voltage; and generating the control signal according to the period of the clock signal.

18. A method for operating an electronic device as defined in claim 17, wherein generating a bias voltage comprises generating a plurality of bias voltages and wherein switching comprises switching between the accumulation condition in which the plurality of bias voltages are coupled to respective capacitive elements and to respective functional blocks, and the release condition in which the biasing block is isolated from the respective capacitive elements and the respective functional blocks.

19. A method for operating an electronic device as defined in claim 17, wherein the functional block comprises an electrically erasable/programmable read-only memory device.

20. A method for operating an electronic device as defined in claim 17, wherein switching comprises maintaining the switch element in the accumulation condition in an operating mode of the functional block and alternately switching the switch element between the accumulation condition and the release condition in a standby mode of the functional block.

21. A method for operating an electronic device as defined in claim 17, wherein the release condition has a variable duration based on a maximum acceptable ripple of the bias voltage and the accumulation condition has a fixed duration selected to insure a full recharge of the capacitive element.

* * * * *